United States Patent
Chen et al.

(10) Patent No.: US 7,612,431 B2
(45) Date of Patent: Nov. 3, 2009

(54) TRENCH POLYSILICON DIODE

(75) Inventors: Qufei Chen, San Jose, CA (US); Robert Xu, Fremont, CA (US); Kyle Terrill, Santa Clara, CA (US); Deva Pattanayak, Saratoga, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 12/009,379

(22) Filed: Jan. 17, 2008

(65) Prior Publication Data

US 2008/0135872 A1 Jun. 12, 2008

Related U.S. Application Data

(62) Division of application No. 11/322,040, filed on Dec. 28, 2005.

(51) Int. Cl.
*H01L 23/58* (2006.01)
(52) U.S. Cl. .................. 257/594; 257/173; 257/175; 257/288; 257/328; 257/355; 257/E21.355; 257/E21.356; 257/E21.357; 257/E21.358; 438/141; 438/197; 438/206; 438/212; 438/268
(58) Field of Classification Search .................. 438/141, 438/983, 197, 206, 270, 212, 268, 272; 257/E21.355, 257/E21.356, E21.357, E21.358, 288, 341, 257/342, 355, 594, 173, 175, 328
See application file for complete search history.

(56) References Cited

U.S. PATENT DOCUMENTS

| | | | |
|---|---|---|---|
| 5,321,289 A | 6/1994 | Baba et al. | |
| 5,502,320 A | 3/1996 | Yamada | |
| 5,547,880 A | 8/1996 | Williams et al. | |
| 5,637,898 A | 6/1997 | Baliga | |
| 5,643,820 A | 7/1997 | Williams et al. | |
| 5,661,322 A | 8/1997 | Williams et al. | |
| 5,751,054 A | 5/1998 | Yilmaz et al. | |
| 5,998,833 A | 12/1999 | Baliga | |
| 5,998,836 A | 12/1999 | Williams | |
| 5,998,837 A | 12/1999 | Williams | |
| 6,046,470 A | 4/2000 | Williams et al. | |
| 6,049,108 A * | 4/2000 | Williams et al. | 257/341 |
| 6,078,090 A | 6/2000 | Williams et al. | |
| 6,140,678 A | 10/2000 | Grabowski et al. | |
| 6,255,683 B1 | 7/2001 | Radens et al. | |
| 6,365,462 B2 | 4/2002 | Baliga | |
| 6,548,860 B1 | 4/2003 | Hshieh et al. | |
| 6,855,593 B2 | 2/2005 | Andoh et al. | |
| 2004/0075145 A1 * | 4/2004 | Shibib | 257/355 |

* cited by examiner

*Primary Examiner*—Long K Tran

(57) ABSTRACT

Embodiments of the present invention include a method of manufacturing a trench transistor. The method includes forming a substrate of a first conductivity type and implanting a dopant of a second conductivity type, forming a body region of the substrate. The method further includes forming a trench in the body region and depositing an insulating layer in the trench and over the body region wherein the insulating layer lines the trench. The method further includes filling the trench with polysilicon forming a top surface of the trench and forming a diode in the body region wherein a portion of the diode is lower than the top surface of the trench.

10 Claims, 21 Drawing Sheets

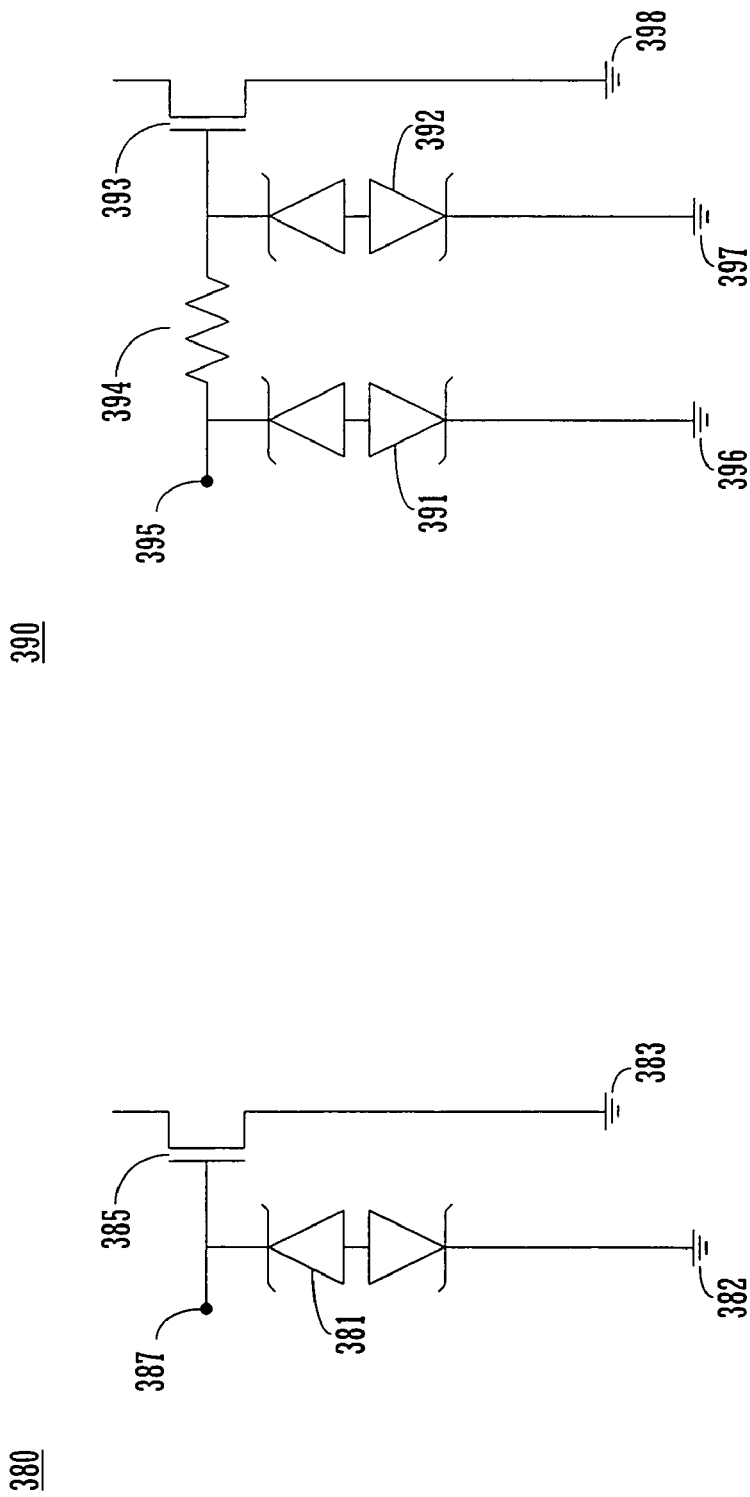

400

```
┌─────────────────────────────────────────────┐
│  FORMING A TRENCH IN THE N⁻(P⁻) EPITAXIAL LAYER │
│                    402                      │
└─────────────────────────────────────────────┘
                      ↓
┌─────────────────────────────────────────────┐
│   FORMING A TRENCH AND GROWING LOCOS OXIDE IN THE │
│                   TRENCH                    │
│                    404                      │
└─────────────────────────────────────────────┘
                      ↓
┌─────────────────────────────────────────────┐
│   DEPOSITING POLYSILICON AND ETCHING BACK POLYSILICON │
│                    406                      │
└─────────────────────────────────────────────┘
                      ↓
┌─────────────────────────────────────────────┐
│ FORMING P⁺(N⁺) POLYSILICON REGION BY DOING P⁺(N⁺) ESD │
│                   IMPLANT                   │
│                    408                      │
└─────────────────────────────────────────────┘
                      ↓
┌─────────────────────────────────────────────┐
│   FORMING N⁺(P⁺) POLYSILICON REGION BY DOING N⁺(P⁺) │
│                SOURCE IMPLANT               │
│                    410                      │
└─────────────────────────────────────────────┘
                      ↓
┌─────────────────────────────────────────────┐
│   FORMING A DIODE IN THE TRENCH POLYSILICON REGION │
│  WHEREIN A PORTION OF DIODE IS LOWER THAN THE TOP │
│              SURFACE OF THE TRENCH          │
│                    412                      │
└─────────────────────────────────────────────┘
```

FIGURE 4

TRENCH POLYSILICON DIODE

CROSS-REFERENCES TO RELATED APPLICATIONS

This application claims benefit to and is a divisional application of U.S. patent application Ser. No. 11/322,040, filed Dec. 28, 2005 which is hereby incorporated by reference.

FIELD OF THE INVENTION

Metal oxide semiconductor (MOS) integrated circuits (ICs) receive input signals through the gate of a MOS transistor. If a high voltage input signal is applied to the gate terminal, the gate oxide layer may be unable to withstand the high voltage and break down. When semiconductor devices are transported by humans or machines, higher than normal input voltages may be produced resulting in damage to the device.

However, the causes of abnormally high voltages are many. For example, electric charges can be produced by friction between surfaces or when an IC is unpacked from plastic packaging. Static electricity can range from several hundreds volts to several thousand volts. If such high voltages are applied to the pins of an IC package, voltage breakdown of the gate oxide layer of a transistor within the package can occur which would result in the transistor being inoperative. As a result, the entire IC could be rendered inoperative.

To prevent such damages to the MOS transistors, protective circuits are connected to pins of an IC package. Such protective circuits are typically connected between each input/output (I/O) pad and the integrated circuit. The protective circuits are designed to conduct when a high voltage is applied to the I/O pad. Hence, these protective circuits provide an electrical path to, e.g., ground, to safely discharge the high voltage.

A surface-formed Zener diode is preferred for ESD (electro-static discharge) protection in MOSFET devices. However, as feature sizes of semiconductor IC devices are reduced, it is important to have flat surfaces for lithography processes to print small features and therefore achieve higher circuit density. A conventional surface-formed polysilicon Zener diode increases surface topology, which reduces the ability to print small features during lithography.

SUMMARY OF THE INVENTION

Embodiments of the present invention include a method of manufacturing a trench polysilicon diode. The method includes forming a substrate of a first conductivity type and implanting a dopant of a second conductivity type, forming a body region of the substrate. The method further includes forming a trench in the body region and depositing an insulating layer in the trench and over the body region wherein the insulating layer lines the trench. The method further includes filling the trench with polysilicon forming a top surface of the trench and forming a diode in the body region wherein a portion of the diode is lower than the top surface of the trench.

Embodiments of the present invention further include a trench transistor comprising electrostatic discharge protection. The trench transistor comprising a substrate of a first conductivity type and a body region over the substrate, wherein the body region comprises a second conductivity type. A trench is formed in the body region, wherein the trench comprises a top surface. An insulating layer lines the trench and is formed over the body region. The trench transistor further comprises a diode formed in the body layer such that a portion of the diode is formed below the top surface of the trench.

The trench polysilicon diode of the present invention significantly reduces the topology of the silicon surface by locating the ESD structure in the silicon. Conventional diode ESD structures are located on the surface of the silicon and increase the topology of the silicon, reducing feature density. In one embodiment of the invention, modifying the stripe source block can specify different breakdown voltages of the ESD structure. In one embodiment of the invention, the trench diode can be also used for clamping and temperature sensing.

BRIEF DESCRIPTION OF THE FIGURES

The accompanying drawings, which are incorporated in and form a part of this specification, illustrate embodiments of the present invention and, together with the description, serve to explain the principles of the invention:

FIG. 3C is a schematic of an exemplary single stage trench polysilicon Zener diode for ESD protection in accordance with embodiments of the present invention.

FIG. 3D is a schematic of an exemplary dual stage polysilicon Zener diode for ESD protection in accordance with embodiments of the present invention.

FIG. 4 is a process flow chart of an exemplary method for manufacturing a trench polysilicon diode in accordance with embodiments of the present invention.

DETAILED DESCRIPTION OF THE INVENTION

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Embodiments of the present invention include a method and structure of a trench polysilicon diode. The trench polysilicon diode of the present invention significantly reduces the topology of the silicon surface by locating the diode structure in the silicon. Conventional diode ESD structures are located on the surface of the silicon and increase the topology of the silicon, reducing feature density. In one embodiment of the invention, modifying the diode implantations can specify different breakdown voltages of the ESD structure. In one embodiment of the invention, the trench diode can be used for clamping and temperature sensing. In one embodiment of the invention, a Zener diode is formed for SD protection and clamping and a trench diode is formed for temperature sensing.

FIGS. 1A, 1B, 1C, 1D, 1E, 1F, 1G, 1h, 1I, 1J, 1K, and 1L are illustrations of various steps performed during exemplary method of manufacturing a vertical trench polysilicon diode in accordance with embodiments of the present invention.

Figure 1A:
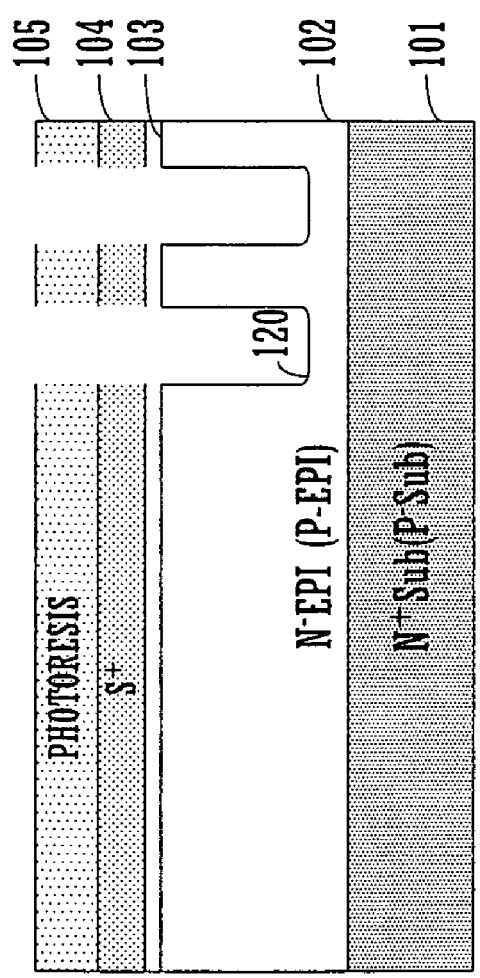
FIGS. 1A, 1B, 1C, 1D, 1E, 1F, 1G, 1$h$, 1I, 1J, 1K, and 1L are illustrations of various steps performed during exemplary method of manufacturing a trench transistor comprising a trench polysilicon diode in accordance with embodiments of the present invention.

In FIG. 1A, an N− doped epitaxial layer 102 is formed over a conventionally N+ doped substrate 101. An oxide pad 103 is formed over the N− doped epitaxial layer 102. In one embodiment of the invention, the oxide pad is approximately 300 angstroms in thickness. In one embodiment of the invention, the oxide pad comprises SiO2. A polysilicon layer 104 is formed over the oxide pad 103. In one embodiment of the invention, polysilicon layer 104 is approximately two thousand angstroms in thickness.

A photoresist layer 105 is used to mask the location of a trench 120. FIG. 1A is an illustration of the semiconductor device after the trench formation. In one embodiment of the invention, the trench 120 is an electrostatic discharge (ESD) trench. In another embodiment of the invention, the trench 120 is part of a trench diode used for a clamping function or for a temperature sensing function.

Figure 1B:
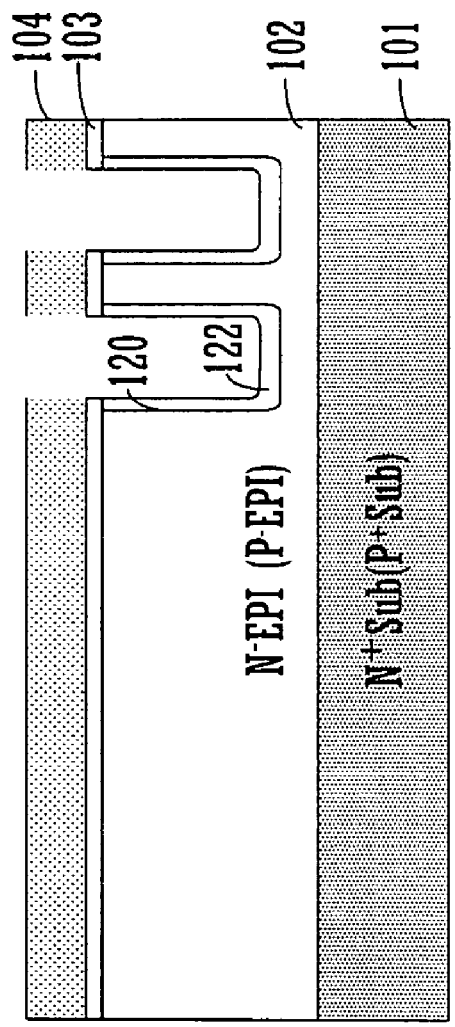

In FIG. 1B, the photoresist layer 105 (of FIG. 1A) is removed and an insulating layer 122 is formed on the inside of the trench 120. In one embodiment of the invention, the insulating layer comprises an oxide. In one embodiment of the invention, the insulating layer is three thousand angstroms in thickness. In one embodiment of the invention, the thickness of the insulating layer 122 depends on the desired protection rating of the diode ESD protection device. For example, a thicker insulating layer 122 will provide a higher protection rating than a thinner insulating layer 122. In one embodiment of the invention, an insulating layer 122 of three thousand angstroms comprises a breakdown voltage (BV) greater than 40 volts. In one embodiment of the invention, the insulating layer 122 is deposited on the top surface of the polysilicon layer 104.

Figure 1C:
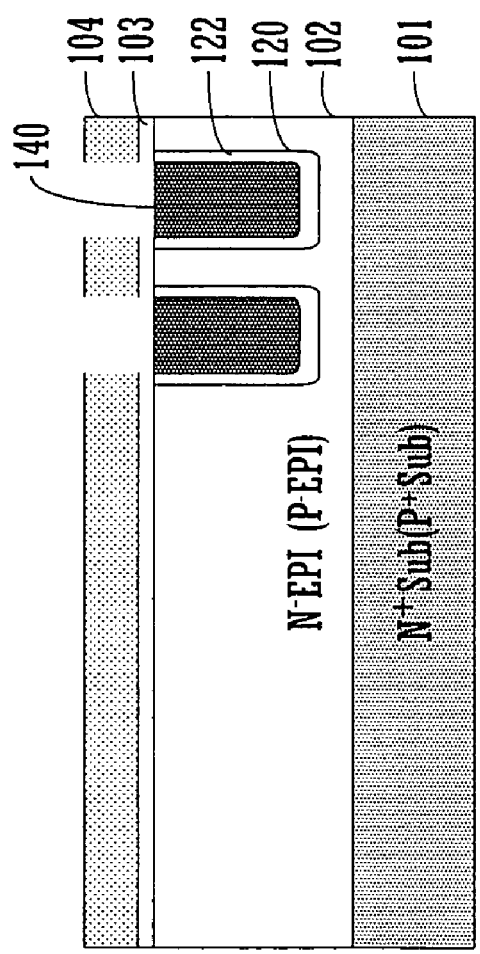

In FIG. 1C, a polysilicon layer 140 is deposited to fill the trench 120. In one embodiment of the invention, the polysilicon layer 140 is 1.5 micrometers thick. The polysilicon layer 140 is deposited over the insulating layer 122. In one embodiment of the invention, the polysilicon layer is deposited over the surface of polysilicon layer 104. In this embodiment of the invention, the oxide layer 122 (when deposited over the polysilicon layer 104) serves as an etch stop. FIG. 1C is an illustration after etchback of the polysilicon layer 140. The remaining polysilicon 140 fills the trench 120. In one embodiment of the invention the trench is filled such that the top of the trench is level with the top layer of the substrate.

Figure 1D:
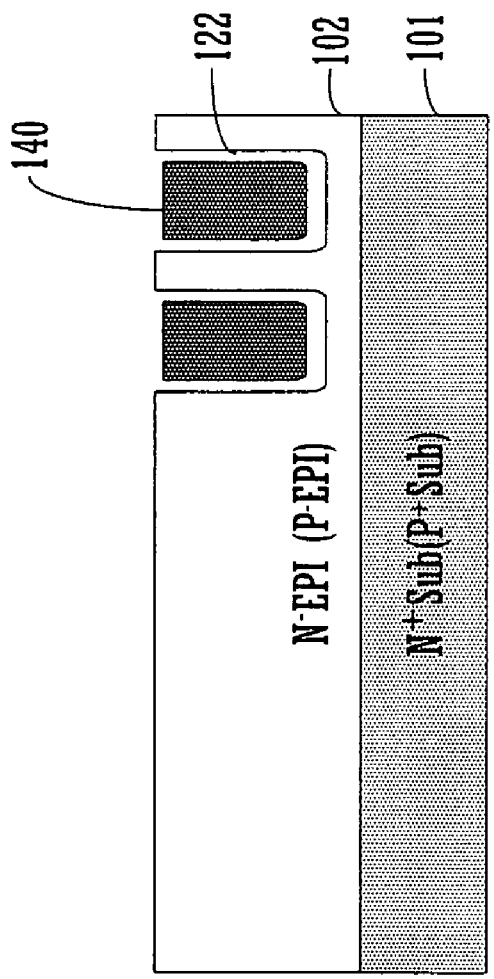

In FIG. 1D, the oxide pad layer 103 and the polysilicon layer 104 are removed. In one embodiment of the invention, the oxide pad layer 103 and the polysilicon layer 104 are removed simultaneously. In one embodiment of the invention, a buffer oxide etch or an HF etch are used to remove the oxide pad layer 103 and the polysilicon layer 104.

Figure 1E:
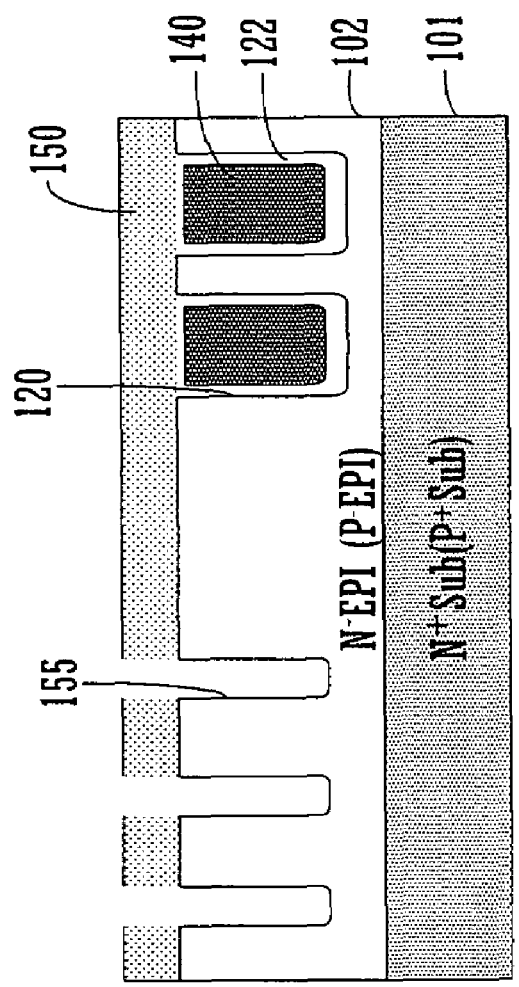

In FIG. 1E, one or more MOSFET transistor trenches 155 are formed adjacent to the diode (ESD) trenches 120. A trench mask (photoresist) 150 masks the location for the MOSFET transistor trenches 155. In one embodiment of the invention, conventional manufacture process is used to form the MOSFET trenches 155.

Figure 1F:
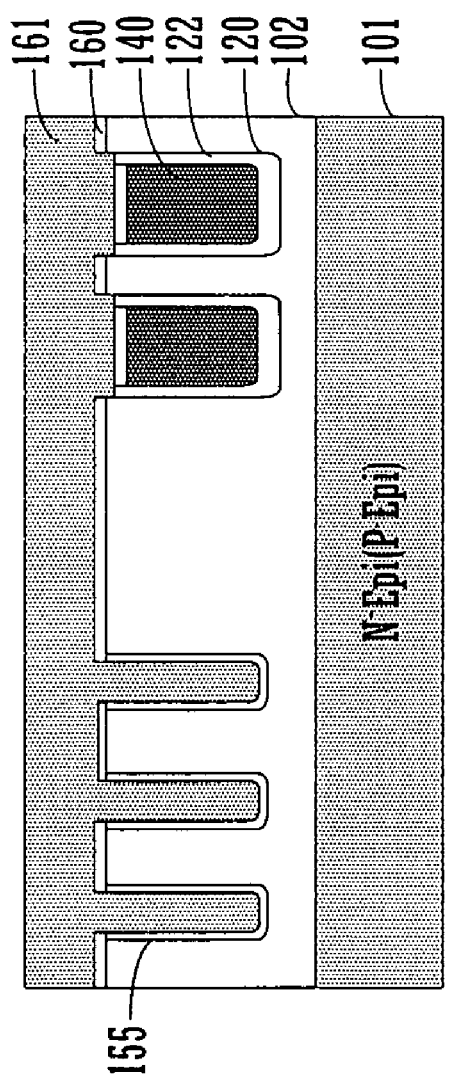

In FIG. 1F, the photoresist 150 is removed and a gate oxide layer 160 is deposited and lines the MOSFET trenches 155. The gate oxide layer 160 is also deposited on the top of the polysilicon 140 that fills the diode (ESD) trenches 120. A gate polysilicon layer 161 is deposited over the gate oxide layer 160. In one embodiment of the invention, the gate polysilicon 161 is approximately one micrometer in thickness.

Figure 1G:
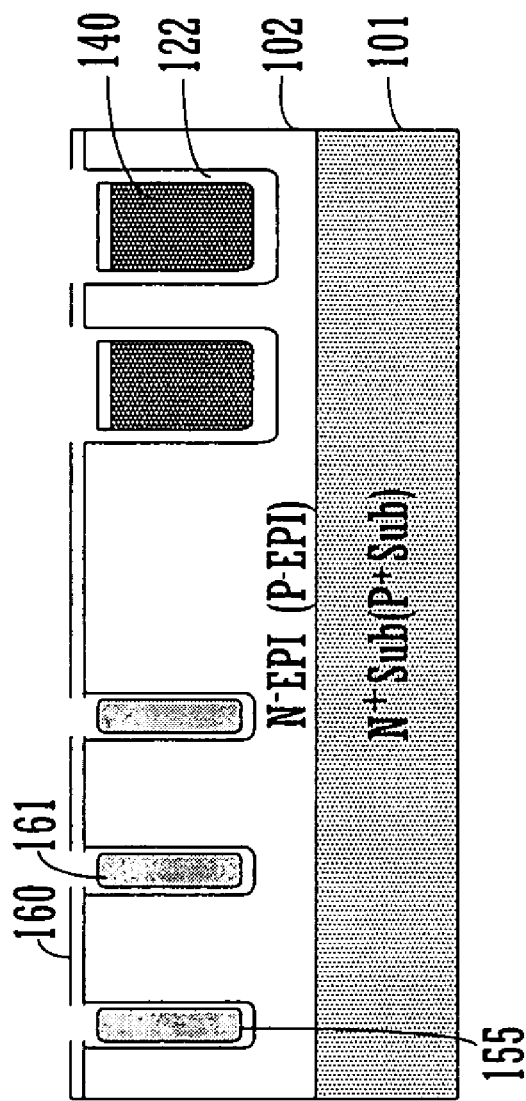

In FIG. 1G, the gate polysilicon 161 is etched back and a remaining portion of the gate polysilicon 161 fills the MOSFET trench 155. In one embodiment of the invention, gate doping can be performed at this step. In one embodiment of the invention, a POCL3 doping is used for the gate doping.

Figure 1H:
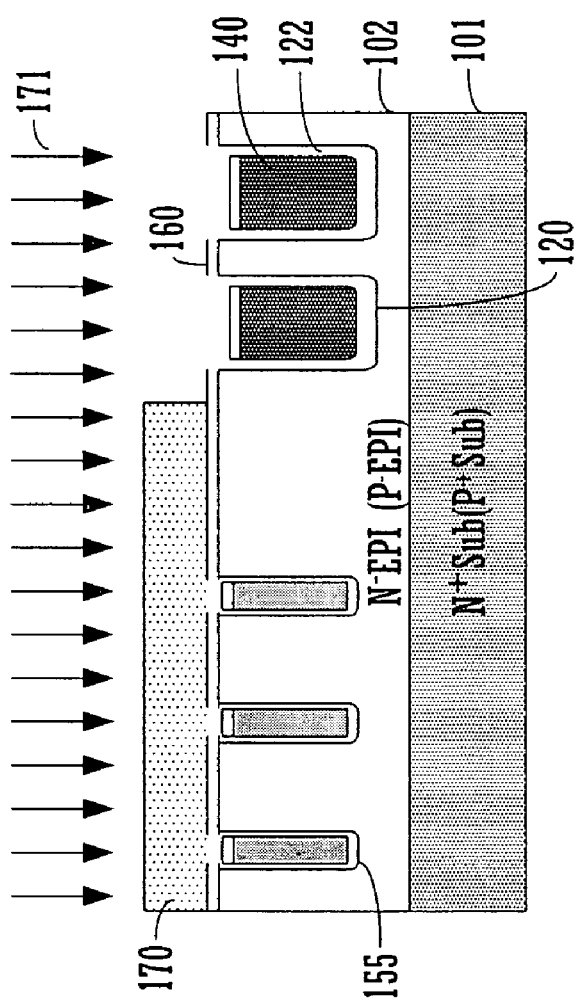
Figure 1I:
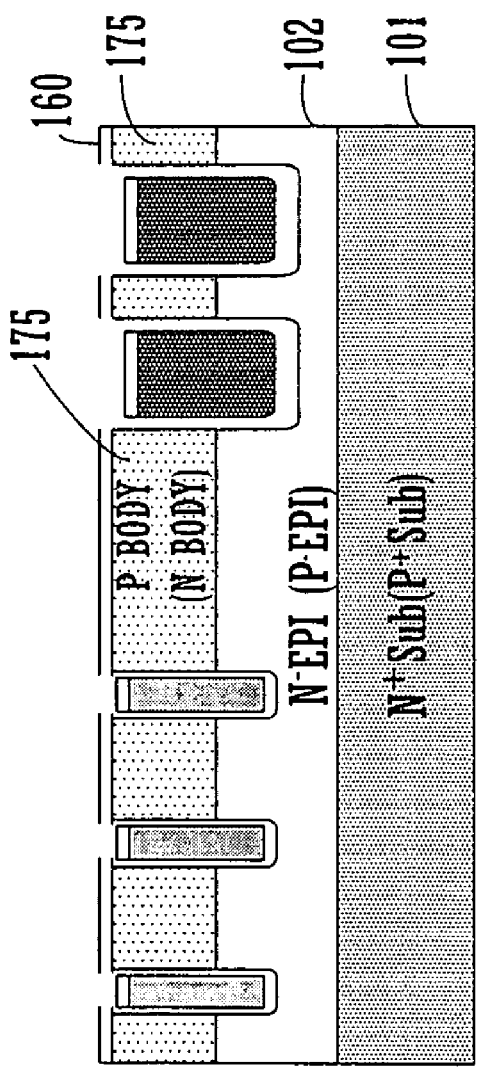

In FIG. 1H, mask 170 is used to protect the MOSFET trenches 155 from an ESD implant 171 to form a P+ type of trench polysilicon diode 175 (of FIG. 1I). The ESD implant can be modified to tune the characteristics of the trench polysilicon diode of the present invention. For example, different implant chemicals can be used for different breakdown voltages of the diode.

In FIG. 1I, a body implant is performed. In one embodiment of the invention, a body block mask is used to form the body implant area. In one embodiment of the invention, the body implant is driven in after implantation.

Figure 1J:
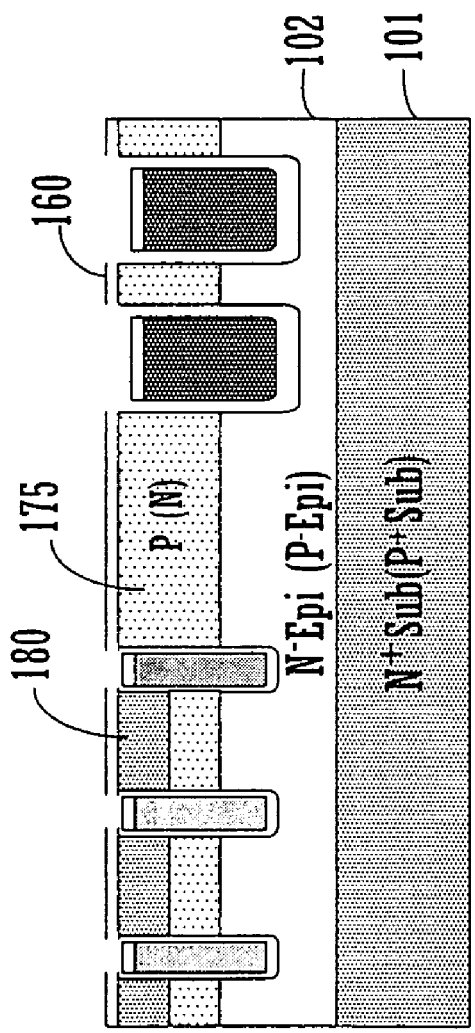

In FIG. 1J, a source block mask is used to form the source implant area and N+ conductivity type regions 180 are formed. The undoped polysilicon region 140 of FIG. 1G is now an N+ doped region 180.

Figure 1K:
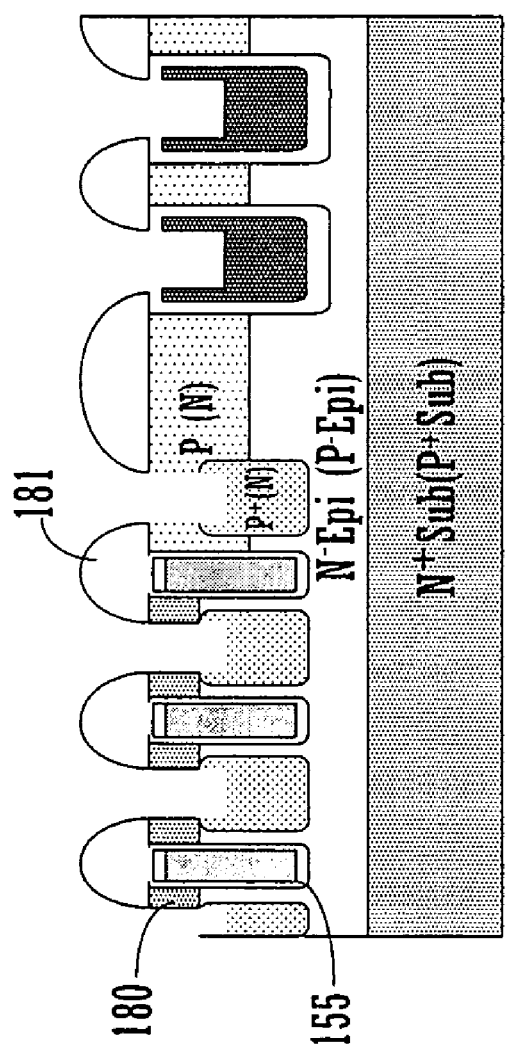
Figure 1L:
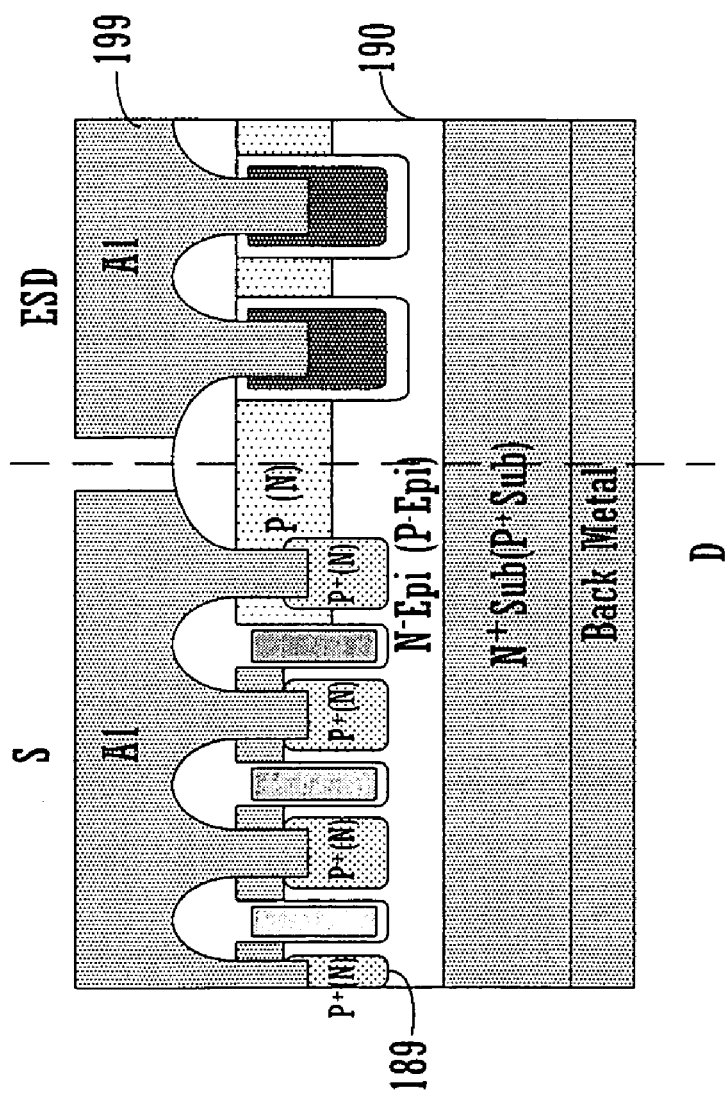

In FIGS. 1K and 1L, the trench transistors 155 are completed in a conventional manner. In FIG. 1K, BPSG (Boro-PhosphoSilicate Glass) regions 181 associated with the source and gate electrodes are patterned and formed and LTO (low temperature oxide) regions 179 are formed. In one embodiment of the invention, a contact mask is used during a contact implant to form a contact. After contact formation, in one embodiment of the invention, a clamping implant can be performed when a clamping function is desired.

In FIG. 1L, metallization 199 is performed to complete the source/drain side 189 of the MOSFET transistor and the ESD side 190.

Figure 2A:
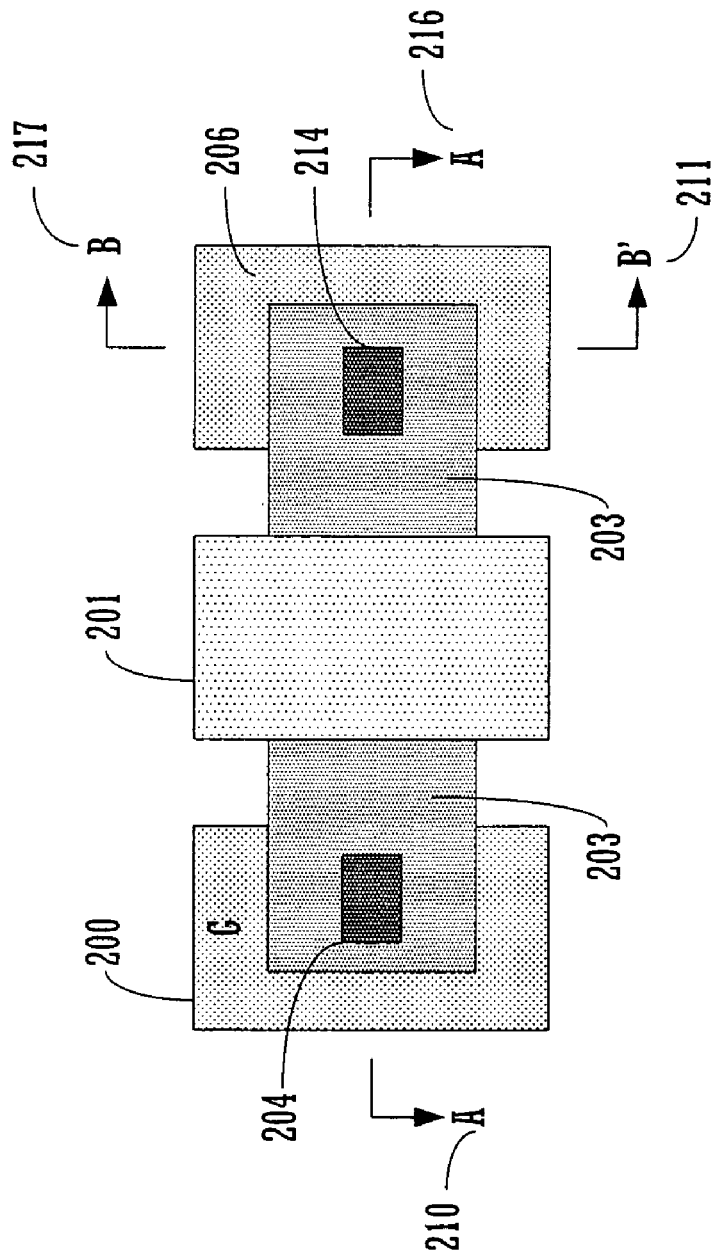
FIG. 2A is an illustration of an exemplary single stripe trench polysilicon diode in accordance with embodiments of the present invention.

FIG. 2A is an illustration of a single stripe vertical trench polysilicon Zener diode cell layout in accordance with embodiments of the present invention. The gate side 200 comprises an $N_+$ conductivity region 203 and a gate contact 204. The ground side 206 also comprises an N+ conductivity region 203 and a ground contact 214. A P type conductivity region 201 is between the N+ conductivity regions 203.

The NPN (e.g., N+ 203, P 201, N+ 203) region forms the trench polysilicon Zener diode of the present invention. In one embodiment of the trench polysilicon Zener diode of the present invention is used for ESD protection. In one embodiment of the invention, multiple polysilicon trench Zener diodes can be coupled (e.g., in parallel) to achieve different ESD protection ratings.

In another embodiment of the invention, the trench polysilicon Zener diode of the present invention is used for a clamping function. In another embodiment of the invention, a trench polysilicon diode of the present invention can be used for temperature sensing. A cross section of the trench polysilicon Zener diode of FIG. 2A can be viewed by bisecting the Zener diode along an axis from A 210 to A' 216 (as illustrated in FIG. 2B.

Figure 2B:
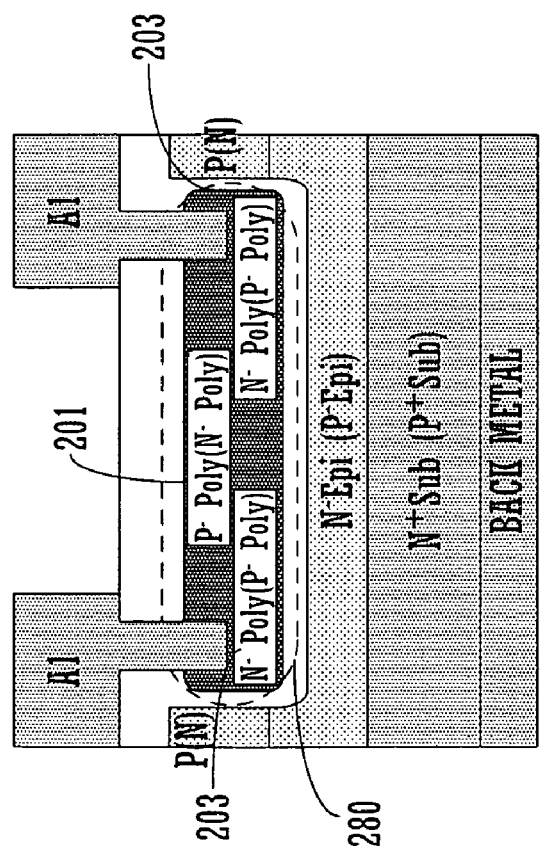
FIG. 2B is an illustration of a first cross section view of a single stripe trench polysilicon diode in accordance with embodiments of the present invention.
Figure 2C:
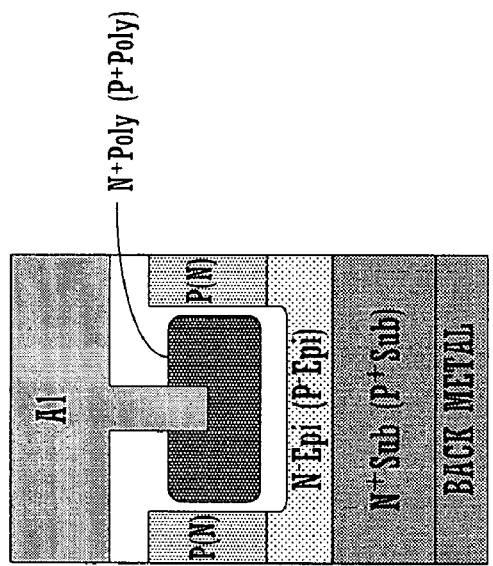
FIG. 2C is an illustration of a second cross section view of a single stripe trench polysilicon diode in accordance with embodiments of the present invention.

FIG. 2B is a cross section of the vertical trench polysilicon diode of FIG. 2A from A 210 to A' 216 (of FIG. 2A). The NPN formation corresponds to the trench polysilicon Zener diode 280 of FIG. 2B.

Figure 3A:
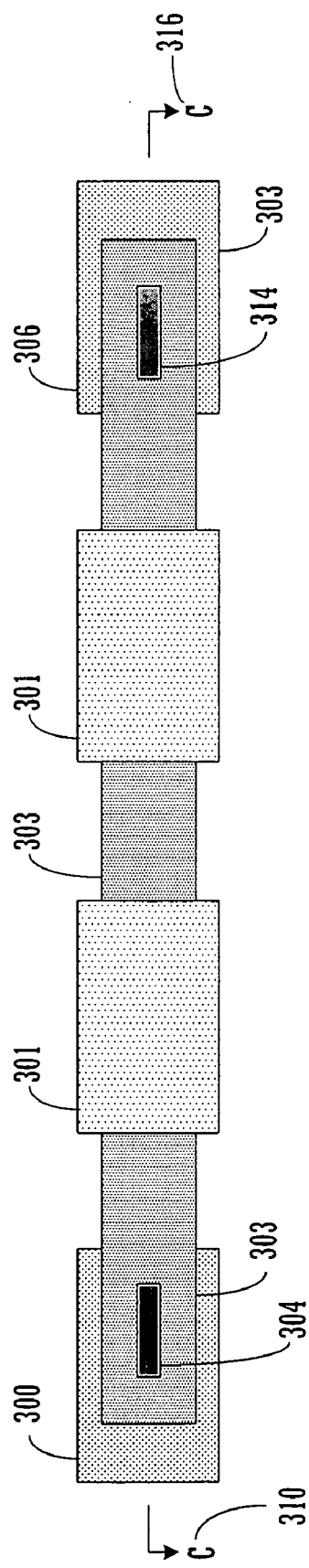
FIG. 3A is an illustration of a double stripe trench polysilicon diode in accordance with embodiments of the present invention.

FIG. 3A is an illustration of a double stripe vertical trench polysilicon Zener diode cell layout in accordance with embodiments of the present invention. The gate side 300 comprises an N+ conductivity region 303 and a gate contact 304. The ground side 306 comprises an N+ conductivity region 303 and a ground contact 314. Two P type conductivity regions 301 are between the N+ conductivity regions 203. Between the two P type conductivity regions 301 is another N+ type conductivity region 303. The NPNPN region forms a plurality of trench polysilicon diodes of the present invention. In one embodiment of the plurality of trench polysilicon diodes of the present invention are coupled and used for ESD protection. A cross section of the trench polysilicon Zener diode of FIG. 3A can be viewed by bisecting the Zener diode along an axis from C 310 to C' 316 (as illustrated in FIG. 3B.

Figure 3B:
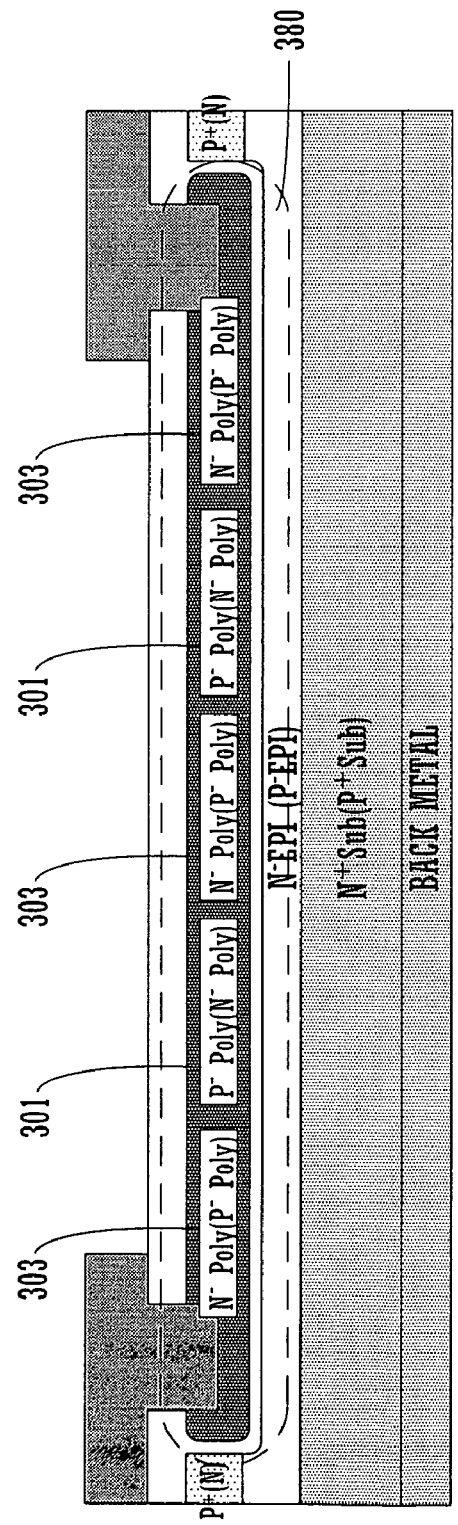
FIG. 3B is an illustration of a cross section view of a double stripe trench polysilicon diode in accordance with embodiments of the present invention.

FIG. 3B is a cross section of the vertical trench polysilicon Zener diode of FIG. 3A from C 310 to C' 316 (of FIG. 3A). The NPNPN formation corresponds to a plurality of trench polysilicon Zener diodes 380 of FIG. 3B coupled together.

FIG. 3C is a schematic of a single stage ESD protection circuit 380 comprising a vertical trench polysilicon Zener diode 381 in accordance with embodiments of the present invention.

FIG. 4 is a flow diagram of an exemplary method for manufacturing a vertical trench polysilicon diode in accordance with embodiments of the present invention. In one embodiment of the invention, the resulting trench polysilicon Zener diode of process 400 is used for ESD protection. In another embodiment of the invention, the resulting trench polysilicon diode of process 400 is used for temperature sensing and/or a clamping function. It is appreciated that method 400 can also be used for manufacturing a trench polysilicon diode that can be used for temperature sensing.

At step 402, process 400 includes forming a substrate of a first conductivity type.

At step 404, process 400 includes implanting a dopant of a second conductivity type, which forms a body region of the substrate formed in step 402.

At step 406, process 400 includes forming a trench in the body region formed in step 404. In one embodiment of the invention, the trench formed in step 406 is an ESD trench.

At step 408, process 400 includes depositing an insulating layer in the trench formed in step 406 and over the body region wherein the insulating layer lines the trench. In one embodiment of the invention, the thickness of the insulating layer and the material used for the insulating layer can be modified to achieve a desired breakdown voltage and ESD rating for the finished diode.

At step 410, process 400 includes filling the trench with polysilicon forming a top surface of the trench.

At step 412, process 400 includes forming a diode in the body region wherein a portion of the diode is lower than the top surface of the trench. In one embodiment of the invention, performing a sequence of implants forms the diode. A first implant is performed to dope the polysilicon deposited in the trench (forming an N+ conductivity region) and a second implant is performed in the body region (forming a P+ type conductivity region).

Figure 5A:
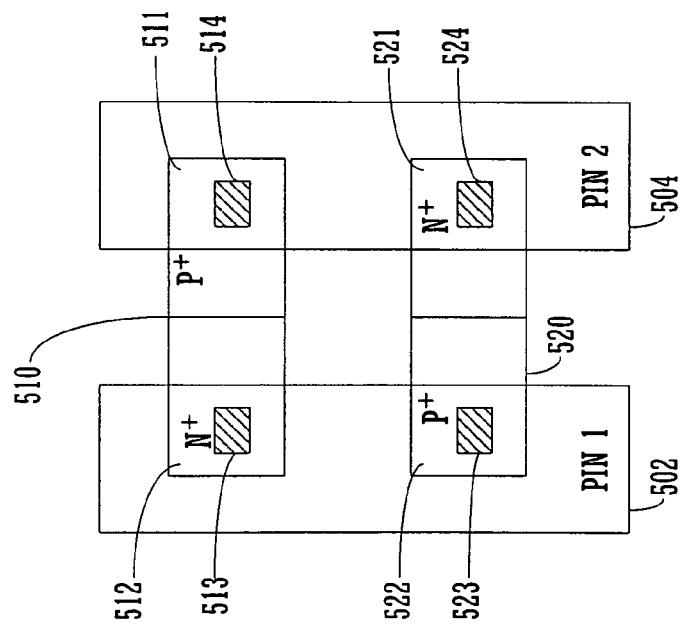
FIG. 5A is an illustration of a temperature sensing circuit comprising vertical trench polysilicon diodes in accordance with embodiments of the present invention.

FIG. 5A is an illustration of an exemplary circuit 500a for sensing temperature in accordance with embodiments of the present invention. The temperature sensor 500a comprises vertical trench polysilicon diodes 510 and 520. The trench polysilicon diodes 510 and 520 are electrically coupled in parallel and are electrically coupled to pins one 501 and two 504.

Trench diode 510 comprises a region of n type conductivity 512 and a region of p type conductivity 511. Diode 510 is electrically coupled to pin one 502 via contact 512 and is electrically coupled to pin two 504 via contact 514.

Trench diode 520 comprises a region of n type conductivity 521 and a region of p type conductivity 522. Diode 520 is electrically coupled to pin one 502 via contact 523 and is electrically coupled to pin two 504 via contact 524.

A temperature can be determined by measuring a voltage between pin one 502 and pin two 504. A look-up table can be used to determine corresponding temperatures for a plurality of voltages.

Figure 5B:
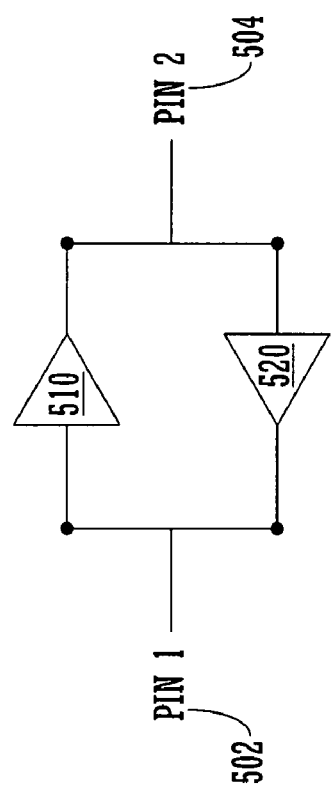
FIG. 5B is a schematic of an exemplary system for sensing temperature comprising vertical trench diodes in accordance with embodiments of the present invention.

FIG. 5B is a schematic view of the temperature sensor 500a of FIG. 5A. Trench polysilicon diodes 510 and 520 are electrically coupled to pins one 502 and two 504. A voltage can be measured between pin one 502 and pin two 504 and a corresponding temperature can be determined by a look-up table, for example. It is appreciated that any number of methods of retrieving a corresponding temperature for a given voltage can be used in accordance with embodiments of the invention.

Embodiments of the present invention, a vertical trench polysilicon diode have been described. While the present invention has been described in particular embodiments, it should be appreciated that the present invention should not be construed as limited by such embodiments, but rather construed according to the following Claims.

What is claimed is:

1. A trench polysilicon diode comprising electrostatic discharge (ESD) protection comprising:
   a N+ (P+) type substrate;
   a N− (P−) type epitaxial region over said substrate;
   a trench formed in said N− (P−) type epitaxial region, said trench comprising a top surface;
   an insulating layer lining said trench;
   a polysilicon filling said trench forming a top surface of said trench;
   a P+ (N+) type doping polysilicon in said trench and formed by a P+ (N+) type ESD implant;
   a N+ (P+) type doping polysilicon in said trench and formed by a N+ (P+) type source implant; and
   a diode formed in said trench such that a portion of said diode is formed below said top surface of said trench, wherein said trench comprises an ESD trench.

2. The trench polysilicon diode as described in claim 1 wherein said insulating layer comprises an oxide.

3. The trench polysilicon diode as described in claim 1 wherein said insulating layer in said trench has a breakdown voltage rating greater than a drain-source breakdown voltage of trench MOSFET transistor for excellent isolation between them.

4. The trench polysilicon diode as described in claim 1 wherein said insulating layer is of a few thousand angstroms in thickness and said insulating layer thickness in said trench depends on its breakdown voltage requirement.

5. The trench polysilicon diode as described in claim 1 wherein said diode is formed prior to the formation of a MOSFET trench of said transistor.

6. The trench polysilicon diode as described in claim 1 wherein said diode is a trench diode and is used for temperature sensing.

7. The trench polysilicon diode as described in claim 1 wherein said N+ (P+) type doped polysilicon in said trench is used as a resistor.

8. The trench polysilicon diode as described in claim 1 wherein said diode is a Zener diode.

9. The trench polysilicon diode as described in claim 8 wherein said Zener diode is used for electrostatic discharge protection.

10. The trench polysilicon diode as described in claim 8 wherein said Zener diode is used for a clamping function.

* * * * *